United States Patent [19]

Artushenko et al.

[11] Patent Number: 5,309,543
[45] Date of Patent: May 3, 1994

[54] METHOD OF MAKING INFRARED CRYSTALLINE FIBER AND PRODUCT

[75] Inventors: Vjacheslav G. Artushenko, Moscow, Russian Federation; Wolfgang Neuberger, Bonn, Fed. Rep. of Germany; Alexey O. Nabatov; Eugene F. Kuzin, both of Moscow, Russian Federation

[73] Assignee: CeramOptec, Inc., Enfield, Conn.

[21] Appl. No.: 980,289

[22] Filed: Nov. 23, 1992

[51] Int. Cl.⁵ .............................. G02B 6/00
[52] U.S. Cl. ..................... 385/142; 385/123; 385/144; 385/145
[58] Field of Search ............... 385/123, 124, 141, 142, 385/144, 145

[56] References Cited

U.S. PATENT DOCUMENTS

| | | | |
|---|---|---|---|
| 3,797,910 | 3/1974 | Westwig | 385/120 |
| 4,253,731 | 3/1981 | Anderson et al. | 385/142 |
| 4,381,141 | 4/1983 | Sakaragel et al. | 385/141 |
| 4,504,298 | 3/1985 | Yokota et al. | 385/141 |
| 4,552,434 | 11/1985 | Murakami et al. | 385/125 |
| 5,182,790 | 1/1993 | Kayashima et al. | 385/141 |

*Primary Examiner*—Frank Gonzalez
*Attorney, Agent, or Firm*—Kenneth P. Glynn

[57] ABSTRACT

The present invention is directed to silver halide fibers. In one embodiment, the fiber has been doped with AgI or a metal compound of the formula MY wherein M is selected from Li, Na, K, Rb, Cr, Mg, Ca, St, Ba, Cd or Hg, and Y is selected from Cl, Br, or I. The fiber has large, elongated grain core structure and decreased infrared transmission losses and a more even/cladding interface in cladded embodiments.

9 Claims, 3 Drawing Sheets

METHOD OF MAKING INFRARED CRYSTALLINE FIBER AND PRODUCT

BACKGROUND OF THE INVENTION

1. Field of the Invention

The present invention relates to a method of making silver halide crystalline fibers capable of transmitting infrared light and to the fiber product made by the process. More specifically, it involves such methods and products which relate to improved $AgCl_xBr_{1-x}$ files (where x is 0 to 1.0).

2. Prior Art Statement

Silver halide fibers consisting of silver chloride (AgCl), silver bromide (AgBr), and their solid solutions ($AgCl_xBr_{1-x}$) show promising properties for the transmission of middle infrared radiation. The fibers can either be bare core fibers, with gas functioning as the lower refractive index, total reflecting medium or polymer coated fibers or core/clad fibers where the cladding contains more AgCl for total internal reflection. These are described in U.S. Pat. Nos. 4,253,731; 4,381,141; 4,504,298 and 4,552,434 and considerable improvements have been reported over time.

Nevertheless, there are some drawbacks in present silver halide crystalline fibers. One basic disadvantage of both bare core and stepindex core/clad silver halide fibers is their tendency to deteriorate optically and mechanically probably due to recrystallization of the grain structure, phase separation and silver colloids formation as well as adsorption and diffusion of extrinsic impurities.

Transmission and elasticity have been observed to decrease remarkably when present state of the art fibers are bent repeatedly. This is a result of defect formation linked to the plastic deformation of the granular structure of the fibers. Present core/clad fibers frequently show intermeshing between the core and the clad material during their extrusion and as a result bad transmission. This defect arises due to inhomogeneous deformation during the conventional extrusion process. However also fibers produced by alternative manufacturing methods such as multiple step-deformation by drawing the fiber through a row of dies as in, for example, U.S. Pat. Nos. 4,381,141; 4,504,298 and 4,552,434, show defects such as microvoids and microcracks. It is assumed that these scattering defects result from the stretching stress applied in this manufacturing method. The core/cladding boundary also shows defects if the process of successive rolling by grooved rolls is applied as suggested in some of the above prior art probably due to the non-symmetric deformation mechanism. Furtheron, trace contamination by lubricants or other extrinsic impurities is generally observed when multiple deformation methods are employed and these methods are more complicated and less productive than the conventional extrusion process.

SUMMARY OF THE INVENTION

The present invention is directed to a method of making silver halide fibers and to the product resulting from that method. In one embodiment, the present invention method involves reducing friction during extrusion by moving an extrusion die in a direction opposite from flowing fiber and against a stationary preform arrangement. In another embodiment, the preform is doped with AgI or a metal compound of the formula MY wherein M is selected from Li, Na, K, Rb, Cr, Mg, Ca, Sr, Ba, Cd or Hg, and Y is selected from Cl, Br and I. The resulting product has large elongated grain core structure and decreased infrared transmission losses and a more even core/cladding interface in cladded embodiments.

BRIEF DESCRIPTION OF THE DRAWINGS

The present invention is more fully understood when the instant specification is taken in conjunction with the drawings which are appended hereto, wherein.

DETAILED DESCRIPTION OF THE INVENTION

Figure 1:
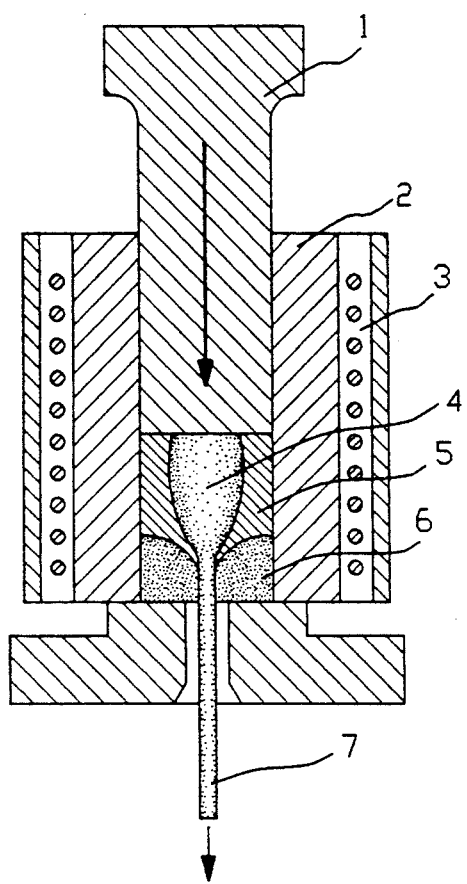
FIG. 1 shows a side cut view of a conventional extrusion processing equipment with the process in progress.

One object of the present invention is to provide a material composition and process for producing an infrared light transmitting crystalline fiber having good and stable elasticity and a stable, low level of optical losses.

The production method should guarantee a grain structure reacting favorable to multiple bending of the fibers. At the same time the method should avoid the current shortcomings of core/clad intermeshing and microcracks/microvoids as well as surface contamination.

The present invention achieves these objectives and overcomes the deficiencies of conventional techniques by stabilizing the composition of the main silver halide components by suitable dopants, by a preextrusion treatment of the preform to form a strengthened profile of texture elongated along the preform axis, and by maintaining laminar flow conditions during the extrusion process by applying the extrusion pressure to the prepared preform in a direction opposite to the fiber flow.

We have found that photodegradation can be remarkably reduced by partially replacing halide anions by iodine and/or partially replacing silver cations by any alkali metals of by double valent cations. It is assumed that the homogenous distribution of the above listed elements in the fiber material creates additional barriers for the sliding and recrystallization effect in polycrystalline fibers and restricts the silver ion diffusion. This self-diffusion of interstitial silver ions determines the formation of silver colloids, that absorb the transmitted radiation.

Metal compounds suitable for doping are MY, type compound wherein M is a metal selected from Li, Na, K, Rb, Cr, Mg, Ca, Sr, Ba, Cd, or Hg and Y is Cl, Br or I.

The expected effect of AgI crystallographic structure transition during the cooling of this crystal after its growth from the melt was surprisingly suppressed by limiting the content of AgI to less then 5% of the AgCl-AgBr matrix.

It was also determined that the concentration of double valent cations (Hg, Dc, Pb, etc.) needs to be restricted to less than 0.001% probably due to the substantial physical difference between them and the host cations of the lattice matrix.

The positive effect of the doping of the silver halide crystals on the transmission stability of the fibers can be observed with any chosen fiber structure (for examples, core only with gas as lower index surrounding, core with polymer cladding, core/clad fiber with silver halide core and lower refractive index silver halide compositions cladding or graded index silver halide fiber).

It was observed that the grain structure in the finished fiber can be influenced by pretreating the preform used for the fiber extrusion. If the preform is carefully deformed by exerting pressure to its lateral surface by preextrusion or by other methods with a low extent of deformation (<2) a texture with elongated grains is achieved. The texture is finer at the outside of the deformed preform while larger crystalline grains are prevailing at the inner core area. We have observed that fibers extruded from above described preforms exhibit similar texture and show improved transmission and stability. It is assumed that the superfine (0.01 to 0.2 $\mu$m) ellipsoidally shaped crystalline grains in the periferical fiber layers deform more elastically and with less defect formation when multiple bending of the fiber occurs, than conventional, round shaped grains. Furtheron, the essentially longitudinal directed radiation rays pass over fewer gain boundaries and defects, which may further explain the enhanced transmission properties.

Referring now to FIG. 1, a conventional prior art extrusion process is shown for a stepindex type preform. This involves applying pressure with a plunger 1 and heat with heater 3 in high pressure chamber 2 to the crystalline preform comprising preform core 4 and cladding preform 5 to force the material in the direction of the applied force and to afterwards deform it through the orifice of a die 6 to obtain a fiber 7 with the desired diameter.

Figure 2:
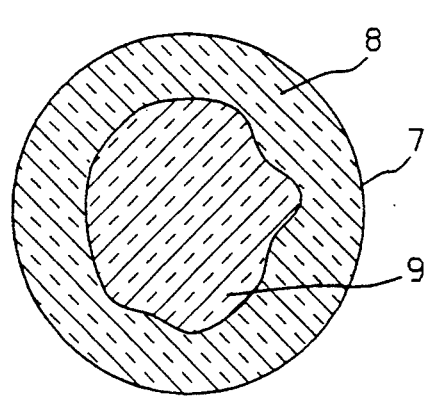
FIG. 2 shows the resulting cross-section for a step-index type infrared crystalline fiber using the method of the prior art shown in FIG. 1.

FIG. 2 shows a cut cross section of fiber 7 from the method shown in FIG. 1. It is observed, unfortunately, that the resulting fiber 7 shows pronounced deformations of the geometry of core 8 and clad 9 and shows intermeshing of core 8 and clad 9 materials. This rough core-cladding interface frequently causes high scattering losses in the fiber.

We attributed this shortcoming of the extrusion process to the friction of the material on the cylindrical chamber surface and the resulting turbulences in the material flow. We have found, however, that by inversing the plunger movement (movement of the plunger in a direction opposite to the fiber movement) the problem can be essentially overcome and the fiber geometry remarkably improved. Thus, FIG. 3 shows one present invention method with apparatus 21.

Figure 3:
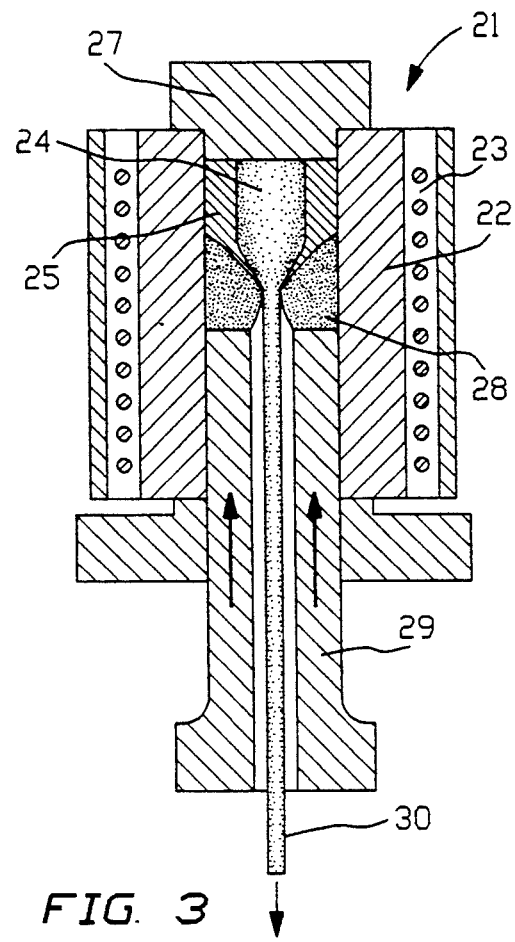
FIG. 3 shows a cut side view of equipment for the extrusion in accordance with the process of this invention with the present invention method in progress.

In FIG. 3, high pressure chamber 22, includes heater 23, core preform 24, and cladding preform 25. However, here plunger 29 is below the preforms and moves upwardly, i.e. against the flow. Cap 27 holds the preforms in place and, as plunger 29 moves die 28 upwardly, fiber 30 is extruded downwardly therefrom.

Figure 4:
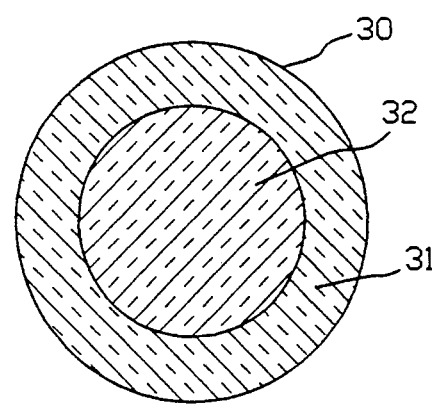
FIG. 4 shows a related cross-section of step-index fiber being produced by the present invention method shown in FIG. 3.

FIG. 4 shows a cross-sectional cut of fiber 30 from the present invention FIG. 3 process, wherein clad 31 and core 32 have a smooth, consistent interface with a relatively consistent clad thickness and core shape.

The main advantage of this method is probably the fixed position of a preform in the chamber which eliminates the friction at the lateral surface of the preform and therefore also eliminates the release of friction energy. The inhomogeneous deformation of complex stepindex or gradient-index preforms due to friction-caused turbulence is practically inhomogeneous. The intermeshing between core and cladding layers is remarkably reduced.

Figure 5:
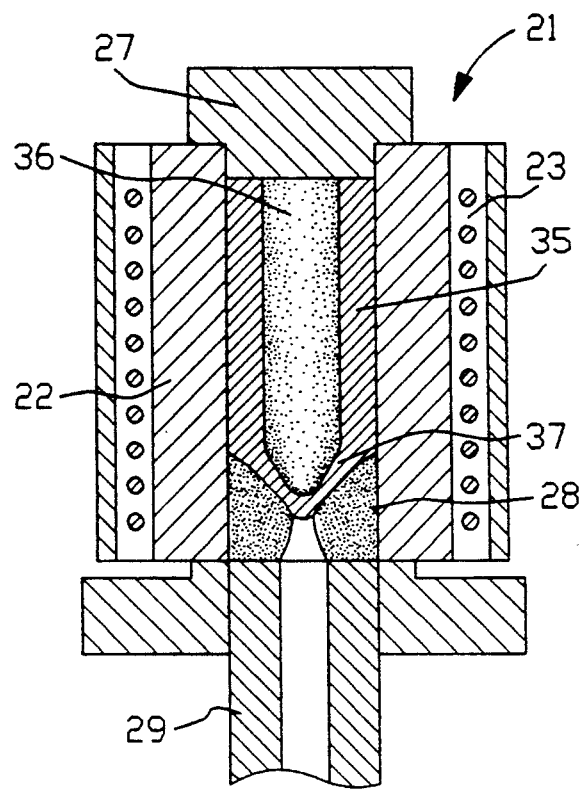
FIG. 5 shows a preferred starting preform geometry for the laminar flow of extrusion in the present invention process.

But even with the above described extrusion process, some residual irregularities for the starting stage of the extrusion may be observed. FIG. 5 shows a further advance. Here the same equipment as shown in FIG. 3 is used, with like parts identically numbered. However, to reach the laminar flow geometry faster, additional cladding material 35 can be inserted not only at the side but also below the cylindrical core preform 36, as shown as base 37.

Further, by keeping the plunger diameter marginally smaller than the preform diameter, surface contamination from the chamber surface or preform surface defects are effectively excluded from entering the finished fiber. In this way, our claimed extrusion process for silver halide fiber production shows additional benefits also for core-only or plastic clad core fiber manufacturing.

Figure 6:
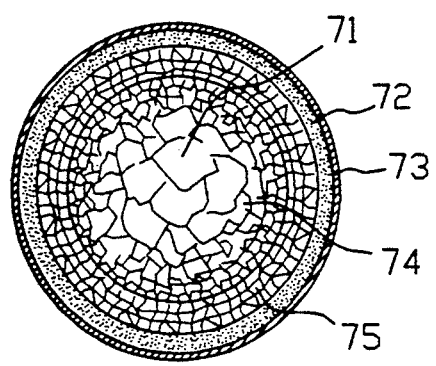
FIG. 6 shows a cross-section of a preform of the present invention with more details and being successively deformed at is periphery, consisting of a crystalline core and a crystalline cladding layer, a layer of polymer lubricant and a protective polymer or metal coating.
Figure 8:
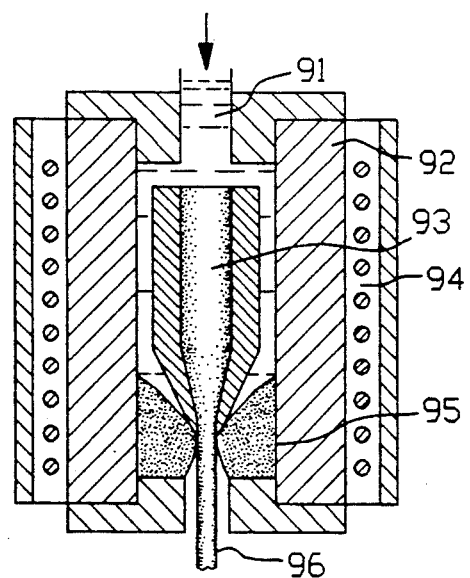

FIG. 6 illustrates a cross-section of a preform successively deformed of its periphery consisting of a core 74 and a crystalline cladding 75, a layer of polymer lubrication 72 and a protective coating 73 of metal or polymer. This preform is particularly advantageous for the present inventive method. Thus, FIG. 8 illustrates a cross section of a present invention system which includes chamber 92, fluid inlet 91, heater 94, die 95, preform 93 and pressurizing fluid 91, to produce fiber 96.

The enhanced quality of the core/cladding boundary in step-index fibers and the improved symmetry in gradient index fibers can also be realized by applying isotropic pressure through gaseous or liquid media. A lubricant, which could be used to reduce friction, can also serve as the liquid medium. Silicon oil or liquid flouropolymers could be used for this purpose. Argon or other inert gases seem particularly suitable for gas extrusion purposes.

The core/clad preform being subjected to extrusion by a plunger moving in a direction opposite to the fiber flow or to liquid or gas extrusion may also be surrounded by an additional layer of relatively soft metal. This metal layer can then be extruded together with the core/clad (or gradient index) crystalline preform to form a fiber already protected by an external metal sheath against light, stresses or contamination.

The above described types of essentially friction free extrusion substantially suppress lateral surface friction—the main cause of macrostructure defects and turbulence intermeshing at the core/cladding boundary.

The present invention is further illustrated by the following examples, but is not limited thereby.

EXAMPLE I

A crystal of solid solution of silver halide with a 50/50 ratio of chlorine and bromine, i.e. $AgCl_{0.5}Br_{0.5}$ was grown with a $Hg^{++}$ dopant (concentration 0,0003%) by known silver halide crystal growing methods and prepared as extrusion billet in cylindrical form (15 mm in diameter and 40 mm long). The billet was extruded into a fiber with 1 mm diameter by the present invention friction free process as shown in FIG. 3 and described above, i.e. by moving the plunger of 14 mm in diameter in the direction opposite to the fiber flow at about 200° C. The optical losses measured in the fiber by the cut-back method at 10.6 μm were 0.2 dB/m immediately after the extrusion and 0.5 dB/m 1 year later. For comparative purposes a fiber of equal diameter was manufactured at the same temperature from a crystal of $AgCl_{0.5}:AgBr_{0.5}$ solid solution by conventional extrusion in FIG. 1 above. Its optical losses were measured as 1 dB/m right after the extrusion and 2.4 dB/m 1 year later. Both fibers were stored in black loose polymer tubes at controlled laboratory conditions to avoid environmental damages.

EXAMPLE II

Figure 7A:
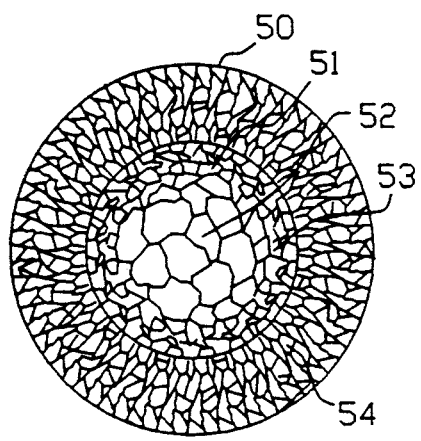
FIGS. 7a and 7b a cross sectional cut of the fiber texture after extrusion of a predeformed core/clad preform of the present invention, and a side cut view of that fiber; and, FIG. 8 shows a side cut view of a present invention method arrangement for hydraulic extrusion in progress.
Figure 7B:
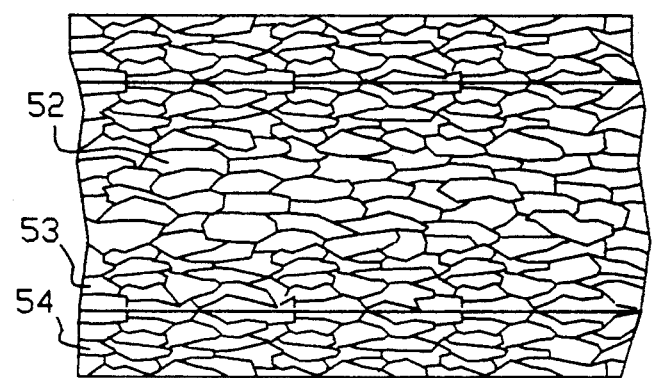

The preform of a structure such as is shown in cross-section in FIG. 6. Structure 73 was formed from a $AgCl_{0.5} AgBr_{0.5}$ core rod (diameter 15 mm), and a $AgCl_{0.7}:AgBr_{0.3}$ cladding tube (15/18 mm diameter), a polyethylene coating tube (18/19 mm diameter) and a OFHC-copper ductile tube (19/20 mm diameter) with a bottom part in a form, suitable for laminar extrusion. Two successive extrusions of this preform through the raw of conical dies were realized with silicon oil as outer lubricant, and the diameters of the orifices were successively decreased from 17 mm to 15 mm. A final friction free extrusion using the FIG. 3 method was realized to obtain 1 mm diameter fiber. The optical losses in the fiber were 1.5 dB/m at 10.6 μm. The tensile strength was remarkably high (120 MPa). Structure investigations of chemically etched fiber samples revealed a texture similar to that shown in FIGS. 7a and 7b, showing a fiber 50 with a core 51 and cladding 54. Note that large, elongated grains 52 are formed toward the center and smaller elongated grains are formed towarad and in the cladding, such as grains 53.

It was observed that the fiber could withstand significantly more and several bend cycles than fibers produced directly from nonpredeformed crystals described above.

EXAMPLE III

A step-index type fiber was produced by the method illustrated in FIG. 3 from a predeformed preform (as shown in FIG. 5). The extrusion billed (15 mm diameter and 40 mm long) consisted of a single crystalline rod of $AgCl_{0.24}:Br_{0.02}$ solid solution (10 mm diameter and 38 mm long) being inserted in a hollow cylinder cladding of $AgCl_{0.5} Br_{0.5}$ solid solution (inner diameter 10 mm, outer diameter 15 mm, length 38 mm) and a disk of cladding material was placed at the bottom (diameter 15 mm and 2 mm thickness). The billet was hot extruded (at about 200° C) by friction free extrusion into a fiber of 0.7 mm outside diameter and 0.47 mm core diameter. Good quality of the core-cladding boundary was observed over the length of about 10 mm.

Without the insertion of the extra cladding material at the bottom (near the die) much smaller yield was observed due to several meters of start up loss.

While the invention has been described in detail and with reference to specific embodiments thereof, it will be apparent to one skilled in the art that various changes and modifications can be made therein without departing from its spirit and scope.

What is claimed is:

1. An unclad optical fiber comprising a silver halide solid solution of the formula $AgCl_xBr_{1-x}$ wherein x ranges from 0 to 1.0, and one or more dopants selected from the group consisting of AgI and those of the formula MY, wherein M may be Li, Na, K, Rb, Cr, Mg, Ca, Sr, Ba, Cd or Hg, and Y may be Cl, Br or I.

2. An optical fiber as claimed in claim 1 wherein the dopant is AgI and the content of AgI is limited to 5% or less by weight and resultant content of double valent cation metallides is limited 0.001% or less of the content of the fiber by weight.

3. The optical fiber of claim 1 wherein said fiber has a core coated with a polymer having a lower refractive index than said core.

4. An optical silver halide fiber exhibiting polycrystalline, essentially void—and microcrack free texture whereby the grain size decreases from the center of the core towards the periphery and the grains are ellipsoidally shaped and oriented with their longitudinal direction parallel to the fiber axes.

5. The optical fiber of claim 4 wherein said fiber is unclad.

6. The optical fiber of claim 4 wherein said fiber has a core coated with a polymer having a lower refractive index than said core.

7. The optical fiber of claim 4 wherein said fiber is clad with a lower refractive index silver halide cladding material of the formula $Ag Cl_z Br_{1-z}$, wherein z is from 0 to 1.0.

8. A optical fiber, comprising a silver halide solid solution of the formula $AgCl_xBr_{1-x}$ wherein x ranges from 0 to 1.0, and one or more dopants selected from the group consisting of AgI and those of the formula MY, wherein M may be Li, Na, K, Rb, Cr, Mg, Ca, Sr, Ba, Cd or Hg, and Y may be Cl, Br or I and wherein said fiber has a core coated with a polymer having a lower refractive index than said core.

9. An optical fiber comprising a silver halide solid solution of the formula $AgCl_xBr_{1-x}$ wherein x ranges from 0 to 1.0, and one or more dopants selected from the group consisting of AgI and those of the formula MY, wherein M may be Li, Na, K, Rb, Cr, Mg, Ca, Sr, Ba, Cd or Hg, and Y may be Cl, Br or I, wherein said fiber is clad with a lower refractive index silver halide cladding material of the formula $Ag Cl_z Br_{1-z}$ wherein z is from 0 to 1.0.

* * * * *